(12) United States Patent
Peng

(10) Patent No.: US 6,833,671 B2
(45) Date of Patent: Dec. 21, 2004

(54) ORGANIC ELECTROLUMINESCENT DEVICE WITH EFFICIENT HEAT DISSIPATION AND METHOD FOR MANUFACTURING THE SAME

(76) Inventor: Kuan-Chang Peng, No. 8, LN 213, Sec. 2, Jingguo Rd., Hsinchu (TW), 300

( * ) Notice: Subject to any disclaimer, the term of this patent is extended or adjusted under 35 U.S.C. 154(b) by 0 days.

(21) Appl. No.: 10/429,838

(22) Filed: May 6, 2003

(65) Prior Publication Data

US 2003/0218421 A1 Nov. 27, 2003

(30) Foreign Application Priority Data

May 23, 2002 (TW) .................................. 91110964 A (51) Int. Cl.[7] .............................................. H05B 33/00
(52) U.S. Cl. ..................... 313/506; 313/504; 313/509; 313/46; 313/44
(58) Field of Search ................................ 313/498–512; 428/917

(56) References Cited

U.S. PATENT DOCUMENTS 4,895,734 A * 1/1990 Yoshida et al. ............. 427/573
5,948,552 A * 9/1999 Antoniadis et al. ......... 428/690
6,265,820 B1 * 7/2001 Ghosh et al. ................ 313/483
6,670,751 B2 * 12/2003 Song et al. .................. 313/512

* cited by examiner

Primary Examiner—Asghok Patel
(74) Attorney, Agent, or Firm—Rosenberg, Klein & Lee (57) ABSTRACT

The present invention describes an organic electroluminescent (EL) device and a method for manufacturing the same. The organic electro-luminescent (EL) device includes: a substrate; at least a first electrode formed on the substrate; at least a heat dissipation layer formed on the first electrode, wherein the heat dissipation layer includes a plurality of contact windows exposing portions of the first electrode; at least an organic layer formed to cross the heat dissipation layer partially, covering the exposed portions of the contact windows to contact the first electrode; and at least a second electrode formed on the organic layer. The heat generated in the organic layer during operation dissipates out of the active region of the device and thus the device lifetime is prolonged and the reliability is enhanced.

12 Claims, 9 Drawing Sheets

ORGANIC ELECTROLUMINESCENT DEVICE WITH EFFICIENT HEAT DISSIPATION AND METHOD FOR MANUFACTURING THE SAME

BACKGROUND OF THE INVENTION

1. Field of the Invention

The present invention generally relates to an organic electroluminescent (to be abbreviated as "EL" hereinafter) device, more particularly, to an organic EL device with efficient heat dissipation employing an additional heat dissipation layer and a method for manufacturing.

2. Description of the Prior Art

The organic EL device has attracted tremendous attention due to its advantages over other display panels. These advantages include larger visual angle, shorter response time, smaller dimension in thickness, lower power consumption, simpler fabrication, no need for backlighting, and the ability for light emitting in a full color range.

Figure 1:
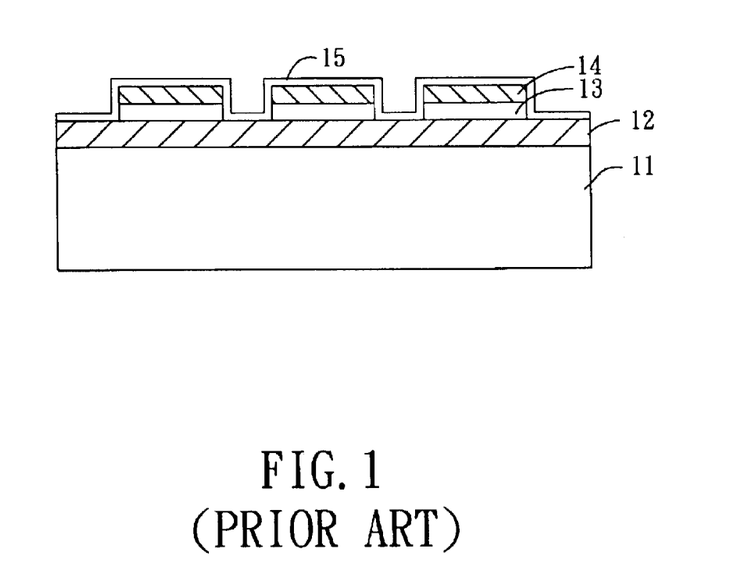
FIG. 1 is a cross-sectional view showing the structure of a conventional organic EL device in accordance with the prior art.

Please refer to FIG. 1, which is a cross-sectional view showing the structure of a conventional organic EL device in accordance with the prior art. The organic EL device is characterized in that at least a first electrode 12 is formed on a substrate 11, furthermore, there are an organic layer 13 with at least an organic emitting layer, and a second electrode 14 formed by sequential evaporation in cross touch way on the first electrode 12. Then, a sealing cap layer 15 formed of resin is employed to protect the organic layer 13 from the external oxygen or the moisture.

Since, in an organic EL device, the light is generated when the electrons and holes from the first electrode 12 and second electrode 14 combine in the organic layer 13 to excite the organic emitting layer, it is inevitable that heat is generated during the luminescence process. Once the heat encounters the moisture existing inside the sealing cap layer 15, dark spots due to oxidation will be formed on the surface of the organic layer 13. The existence of such dark spots adversely affects the luminescence quality such as luminescence intensity and luminescence uniformity of an organic EL device. According to the so-called "10-degree rule", the lifetime of the device reduces to half for every 10-degree rise in operation temperature. Therefore, for a highly heat-generating device, the performance as well as the lifetime depends strongly on the ability in heat dissipation. More seriously, the lifetime of an organic EL device may be substantially shortened.

In order to overcome the image defects and shortened lifetime due to the disability in heat dissipation, the industry has developed a number of prior art organic EL displays, for example, in U.S. Pat. No. 5,948,552 "Heat-resistant organic electroluminescent device" filed by Antoniadis, et al. and U.S. Pat. No. 4,895,734 "Process for forming insulating film used in thin film electroluminescent device" filed by Yoshida, et al. However, in the aforementioned prior arts, additional materials are required with little concerns in structural reform. Little improvement in device performance is disclosed for organic EL devices.

Therefore, there is need in providing an organic EL device with efficient heat dissipation employing an additional heat dissipation layer and a method for manufacturing such a device so as to prolong the lifetime and improve the reliability.

SUMMARY OF THE INVENTION

Therefore, it is the primary object of the present invention to provide an organic EL device and a method for manufacturing such a device, characterized in that a heat dissipation layer is interposed between the first electrode and the organic layer and that a plurality of contact windows are provided in the heat dissipation layer so as to connect the organic layer and the first electrode, such that the heat generated in the organic layer during operation dissipates out of the active region of the device and thus the device lifetime is prolonged and the reliability is enhanced.

It is another object of the present invention to provide an organic EL device and a method for manufacturing such a device, characterized in that structural reform of the heat dissipation layer and the contact windows facilitates the development of the organic EL device.

It is still another object of the present invention to provide an organic EL device and a method for manufacturing such a device, characterized in that structural reform with a few more processing steps not only overcomes the problems related to the disability in heat dissipation but also reduces the manufacturing cost.

It is still another object of the present invention to provide an organic EL device and a method for manufacturing such a device, characterized in that the heat dissipation layer has good electric conductance such that the voltage drop across the first electrode and the organic layer is significantly reduced.

In order to achieve the foregoing objects, the present invention provides an organic EL device, comprising: a substrate; at least a first electrode formed on the substrate; at least a heat dissipation layer formed on the first electrode, wherein the heat dissipation layer comprises a plurality of contact windows exposing portions of the first electrode; at least an organic layer formed to cross the heat dissipation layer partially, covering the exposed portions of the contact windows to contact the first electrode; and at least a second electrode formed on the organic layer.

The present invention further provides a method for manufacturing an organic EL device, comprising steps of:

a. forming at least a first electrode and a heat dissipation layer in turn on a substrate;

b. forming a plurality of contact windows by etching portions of the heat dissipation layer so as to expose portions of the first electrode corresponding to the portions of the heat dissipation layer;

c. forming at least an organic layer to cross the heat dissipation layer partially, so as to cover the contact windows and contact the first electrode; and d. forming at least a second electrode by vertical evaporation on the organic layer.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE INVENTION

The present invention providing an organic EL device with efficient heat dissipation employing an additional heat dissipation layer and a method for manufacturing such a device can be exemplified by the preferred embodiments as described hereinafter.

To start with, please refer to FIGS. 2A to 2E, which are cross-sectional views showing the processing steps of an organic EL device in accordance with one preferred embodiment of the present invention, and FIGS. 3A to 3E, which are 3-dimensional views showing the structure of an organic EL device in FIGS. 2A to 2E.

As shown in the figures, the method for manufacturing an organic EL device comprises steps of.

Figure 2A:
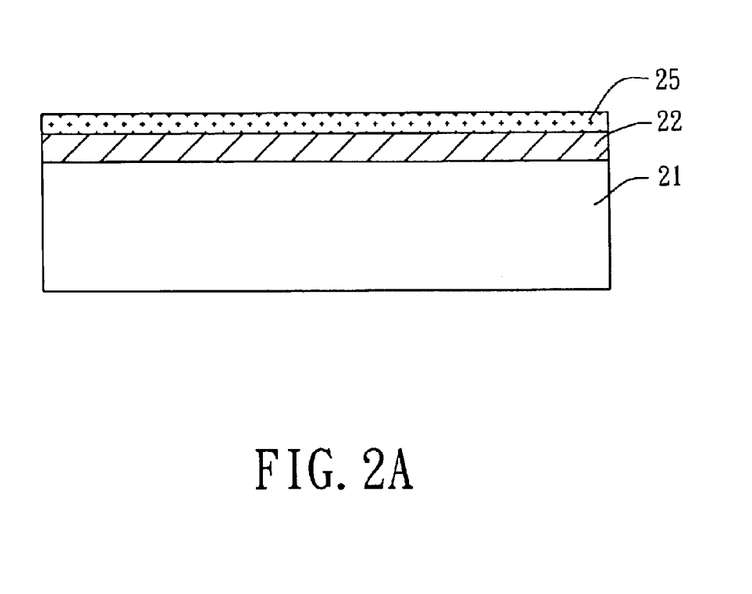
FIGS. 2A to 2E are cross-sectional views showing the processing steps of an organic EL device in accordance with one preferred embodiment of the present invention.
Figure 3A:
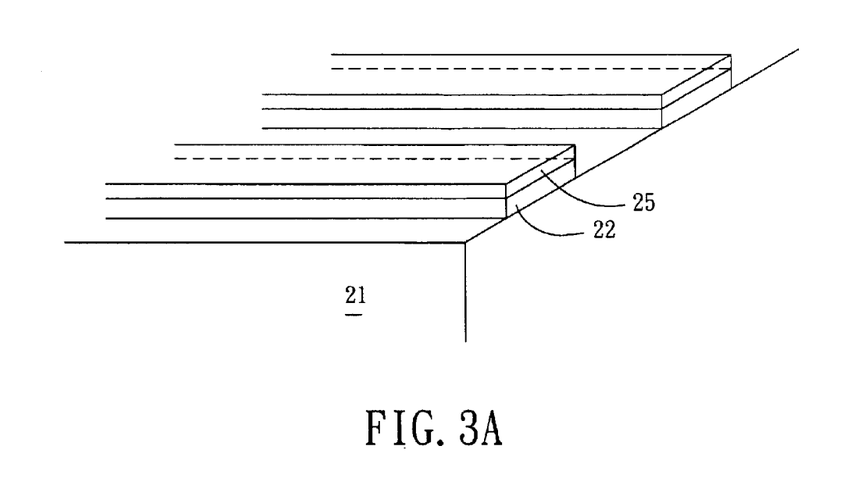
FIGS. 3A to 3E are 3-dimensional views showing the structure of an organic EL device in FIGS. 2A to 2E.

Step 1: A first electrode 22 and a heat dissipation layer 25 are formed in turn on a substrate 21, as shown in FIG. 2A and FIG. 3A. More particularly, the substrate 21 is a glass substrate. The first electrode 22 is formed of a transparent material such as indium-tin oxide (ITO). The heat dissipation layer 25 is formed of a material selected from a group consisting of Cu, Au, Ag, W, Mo, metallic compounds such as AlN, $Al_2O_3$, MgO, BeO, TiB2 and nonmetallic compounds such as BN, epoxy resin and SiC.

Figure 2B:
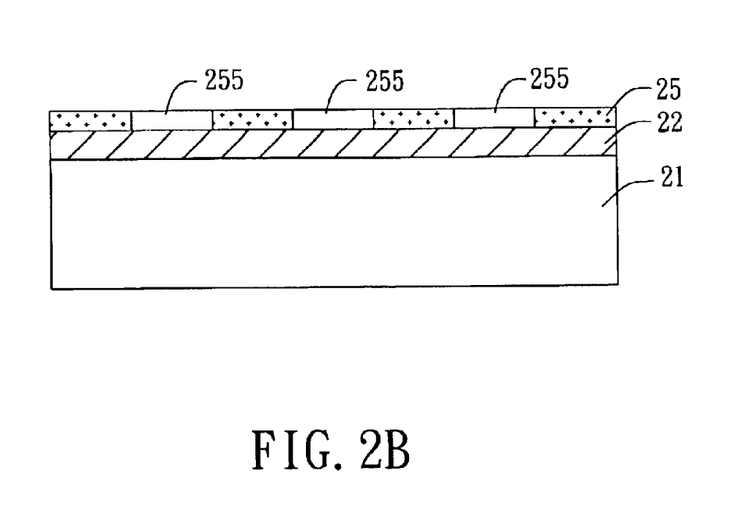
Figure 3B:
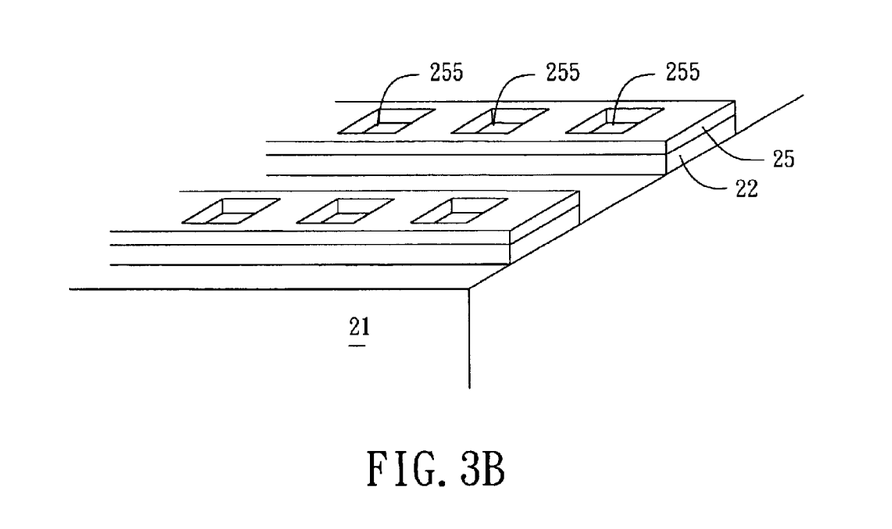

Step 2: A plurality of contact windows 255 are formed by etching portions of the heat dissipation layer 25 so as to expose portions of the first electrode 22 corresponding to the portions of the heat dissipation layer 25, as shown in FIG. 2B and FIG. 3B.

Figure 2C:
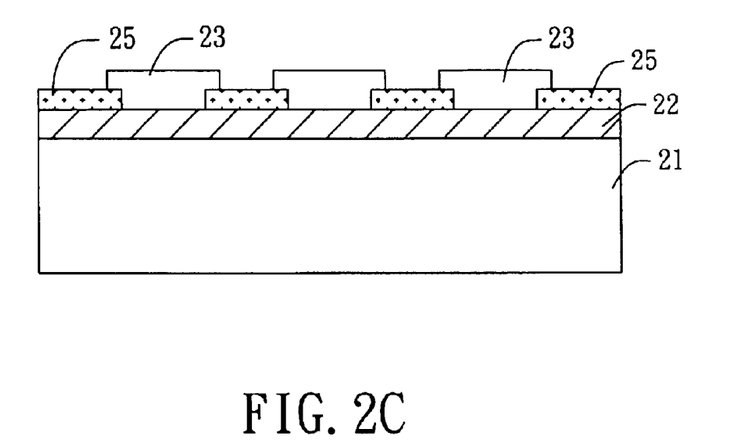
Figure 3C:
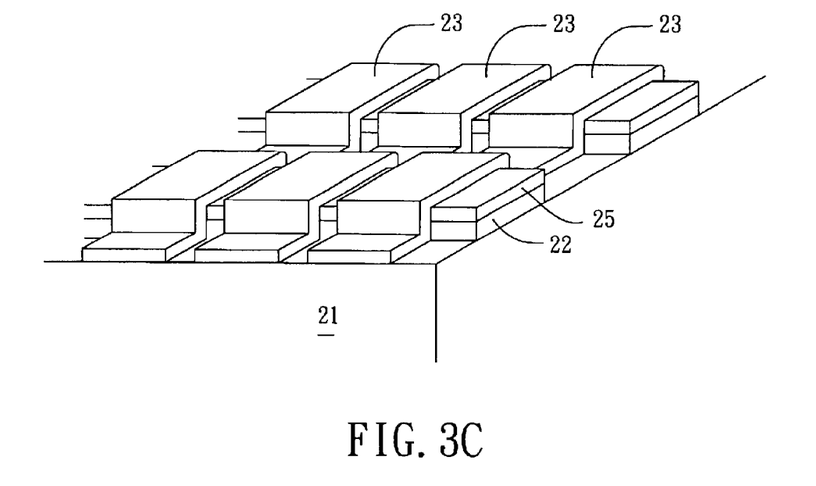

Step 3: An organic layer 23 comprising at least one of an organic hole transport layer, an organic emitting layer and an organic electron transport layer is formed by evaporation to cross the heat dissipation layer 25 partially, so as to cover the contact windows 255 and contact the first electrode 22, as shown in FIG. 2C and FIG. 3C.

Figure 2D:
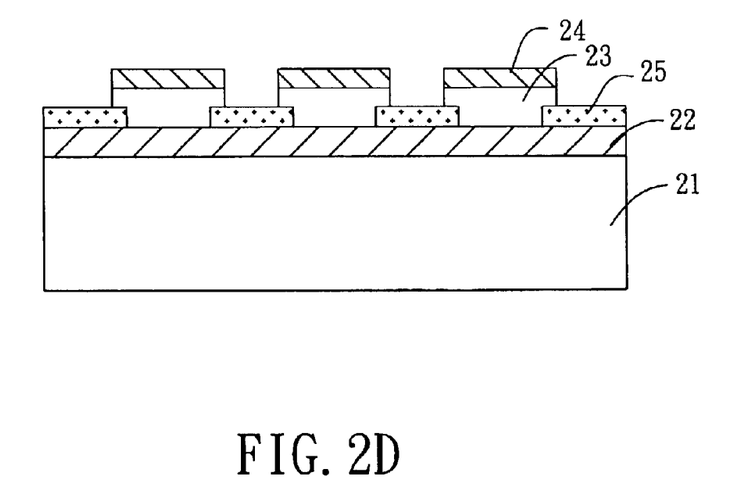
Figure 3D:
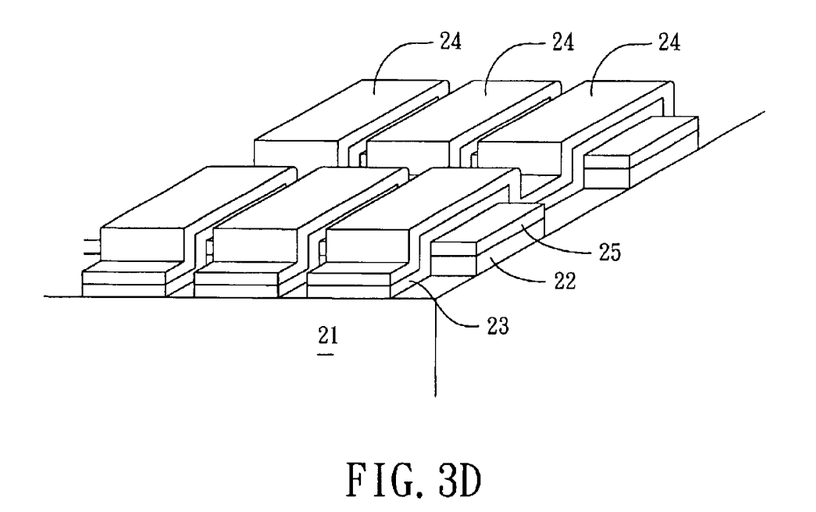

Step 4: A second electrode 24 is formed by vertical evaporation on the organic layer 23 such that the second electrode 24 electrically contact the first electrode 22 through the organic layer 23 in the contact windows 255, as shown in FIG. 2D and FIG. 3D.

Figure 2E:
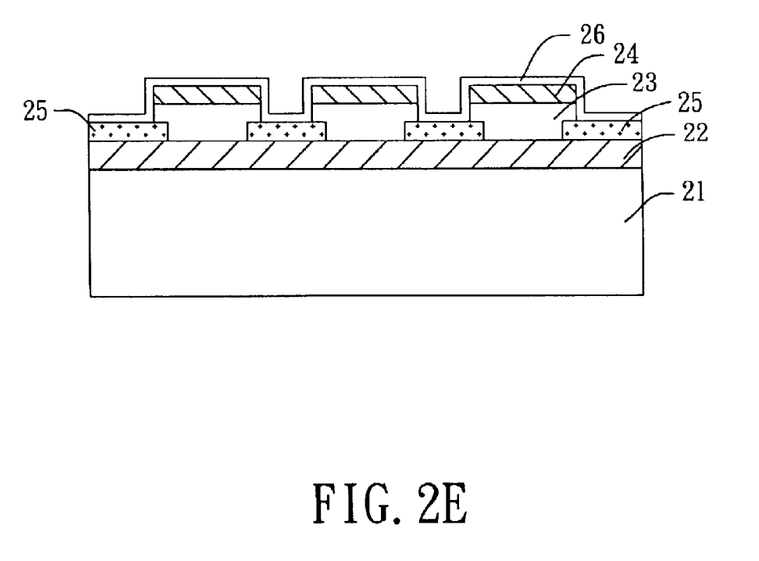
Figure 3E:
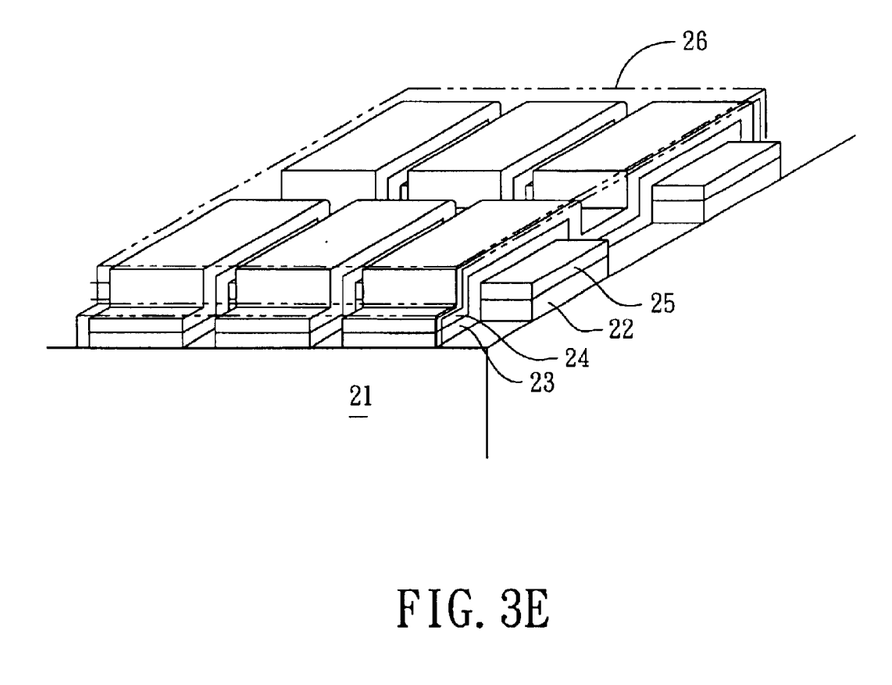

Step 5: Like conventional arts, a sealing cap layer 26 formed of resin is formed to cover the whole device so as to prevent the organic layer 23 from being oxidized, as shown in FIG. 2E and FIG. 3E.

In the present invention, the heat dissipation layer 25 contacts the organic layer 23, therefore the heat generated in the organic layer 23 when electricity conducts between the first electrode 22 and the second electrode 24 dissipates out of the active region through the heat dissipation layer 25. In other words, the ability in heat dissipation is enhanced by employing simple structural reform and processing steps.

In order to prevent crosstalk due to undesirable contact between the first electrode 22 and the second electrode 24 and to ensure that the organic layer 23 contacts the heat dissipation layer 25 so as to enhance heat dissipation, the organic layer 23 may cover the peripheral portions of the heat dissipation layer 25 adjacent to the contact windows 255. Certainly, the organic layer 23 is formed of one selected from a group consisting of an organic material for blue light emitting (B), an organic material for green light emitting (G), an organic material for red light emitting (R) and combination thereof.

Figure 4:
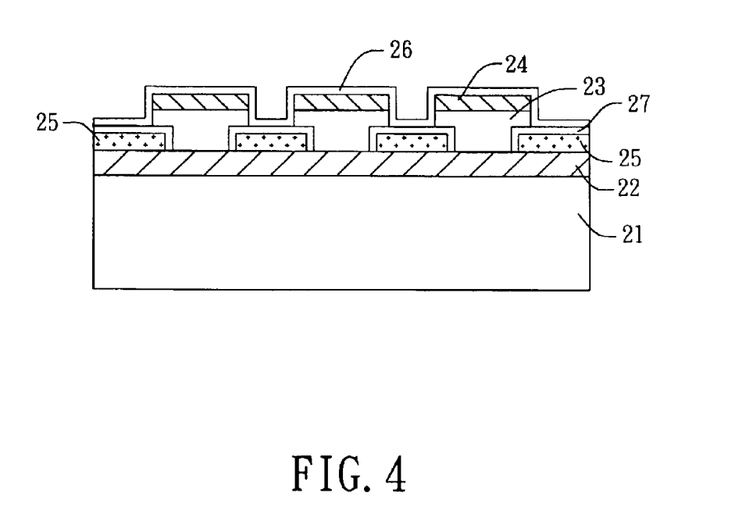
FIG. 4 is a cross-sectional view showing the structure of an organic EL device in accordance with another embodiment of the present invention.

Furthermore, please refer to FIG. 4, which is a cross-sectional view showing the structure of an organic EL device in accordance with another embodiment of the present invention. As shown in the figure, after Step 2, a dielectric insulating layer 27 is formed on the heat dissipation layer 25. Photolithography or etching is employed on the dielectric insulating layer 27 so as to form a plurality of contact windows 225. The dielectric insulating layer 27 serves to ensure to isolate the second electrode 24 from the first electrode 22 so as to prevent the undesirable short circuit and crosstalk. On the other hand, with the dielectric insulating layer 27, the heat dissipation layer can be implemented by using an electrically conductive material such as a metallic compound. Therefore, the electric current tends to flow in the heat dissipation layer 25 that has better electric conductivity than the first electrode 22, which significantly reduces the voltage drop across the first electrode and the organic layer.

Figure 5:
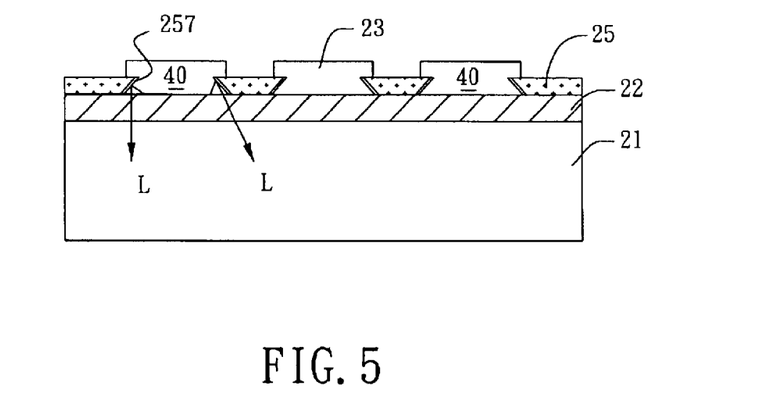
FIG. 5 is a cross-sectional view showing the structure of an organic EL device in accordance with still another embodiment of the present invention.

Moreover, please refer to FIG. 5, which a cross-sectional view showing the structure of an organic EL device in accordance with still another embodiment of the present invention. As shown in the figure, the present embodiment is characterized in that the contact windows 255 in previous embodiment in FIG. 2 is anisotropically etched to have an undercut edge such that the edge of the undercut contact window 40 reflects the lateral light emitted from the organic layer 23, as indicated by the arrow L, to the active region to enhance the light intensity. Certainly, in FIG. 4, the contact window has a T-shape when the light is designed to be emitted through the substrate 21. On the contrary, the contact window has an undercut edge when the light is designed to be emitted through the second electrode 24. Furthermore, in order to enhance the light emitting-efficiency, a reflection layer 257 is formed on the undercut portion of the contact window 40.

Figure 6:
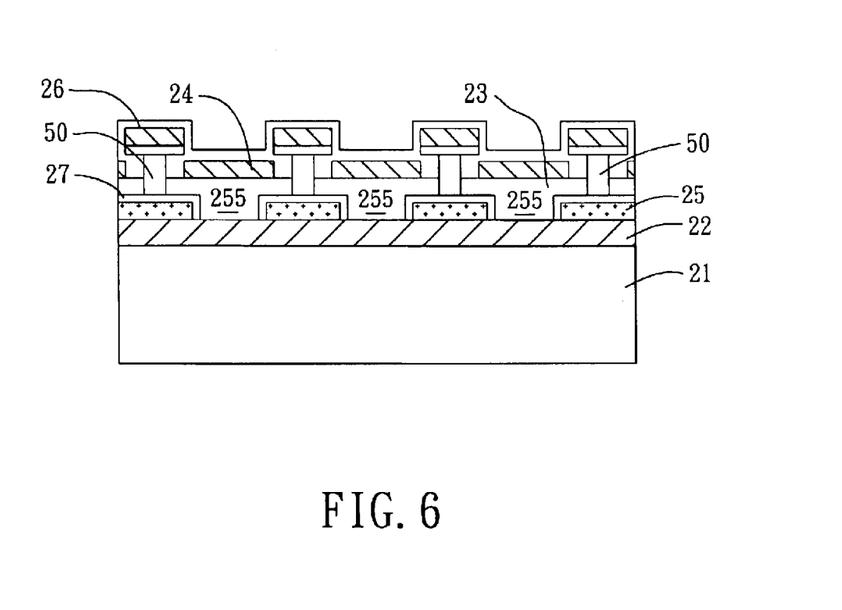
FIG. 6 is a cross-sectional view showing the structure of an organic EL device in accordance with yet another embodiment of the present invention.

Furthermore, please refer to FIG. 6, which is a cross-sectional view showing the structure of an organic EL device in accordance with yet another embodiment of the present invention. As shown in the figure, a dielectric insulating layer 27 is formed on the heat dissipation layer 25. Also, a plurality of isolation ribs 50 are formed on portions of the dielectric insulating layer 27 in favor of the formation of the second electrode 24. The isolation ribs 50 are formed by anisotropically etching an isolation layer that has been formed on the dielectric insulating layer 27. A contact window 255 is then formed by etching the dielectric insulating layer 27 and the heat dissipation layer 25 between two of the isolation ribs 50. When the heat dissipation layer 25 is implemented by using a nonmetallic insulating material, the isolation ribs 50 can be formed of a metallic material so as to enhance heat dissipation. Certainly, with the use of the dielectric insulating layer 27, the heat dissipation layer 25 can be formed of an electrically conductive material so as to reduce the voltage drop across the first electrode 22 and the organic layer 23. Furthermore, the isolation ribs 50 provide excellent ability in heat dissipation so as to prevent the generation of dark spots.

According to the above discussion, the present invention discloses an organic EL device with efficient heat dissipation employing an additional heat dissipation layer and a method for manufacturing such a device so as to prolong the lifetime, characterized in that the heat generated in the organic layer during operation dissipates out of the active region of the device and thus the device lifetime is prolonged and the reliability is enhanced. Therefore, the present invention has been examined to be novel, non-obvious and useful.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. An organic electro-luminescent (EL) device with efficient heat dissipation, comprising:

a substrate;

at least a first electrode formed on said substrate;

at least a heat dissipation layer formed on said first electrode, wherein said heat dissipation layer comprises a plurality of contact windows exposing portions of said first electrode;

at least an organic layer formed to cross said heat dissipation layer partially, covering said contact windows so as to contact said first electrode; and at least a second electrode formed on said organic layer.

2. The organic EL device as recited in claim 1, wherein said heat dissipation layer is formed of a material selected from a group consisting of Cu, Au, Ag, W, Mo, metallic compounds such as AlN, $Al_2O_3$, MgO, BeO and $TiB_2$.

3. The organic EL device as recited in claim 1, wherein said heat dissipation layer is formed of a material selected from a group consisting of nonmetallic compounds such as BN, epoxy resin and SiC.

4. The organic EL device as recited in claim 1, wherein said contact windows in said heat dissipation layer have an undercut edge in favor of light reflection.

5. The organic EL device as recited in claim 1, wherein said organic layer further covers peripheral portions of said heat dissipation layer adjacent to said contact windows.

6. The organic EL device as recited in claim 1, further comprising a plurality of isolation ribs on portions of said heat dissipation layer.

7. The organic EL device as recited in claim 3, further comprising a plurality of isolation ribs formed of a metallic compound material on portions of said heat dissipation layer.

8. The organic EL device as recited in claim 1, further comprising at least a dielectric insulating layer on said heat dissipation layer.

9. The organic EL device as recited in claim 8, wherein said heat dissipation layer is formed of a metallic material with superior electric conductivity.

10. The organic EL device as recited in claim 8, further comprising a plurality of isolation ribs on portions of said heat dissipation layer.

11. The organic EL device as recited in claim 10, wherein said isolation ribs are formed of a material selected from a group consisting of Cu, Au, Ag, W, Mo, metallic compounds such as AlN, $Al_2O_3$, MgO, BeO, $TiB_2$ and nonmetallic compounds such as BN, epoxy resin and SiC.

12. The organic EL device as recited in claim 1, further comprising at least a reflection layer on undercut portions of said contact windows.

* * * * *